United States Patent [19]

Yeh et al.

[11] Patent Number: 5,776,835

[45] Date of Patent: Jul. 7, 1998

[54] METHOD OF MAKING A GROOVED GATE STRUCTURE OF SEMICONDUCTOR DEVICE

[75] Inventors: Ching-Fa Yeh; Jwinn Lein Su, both of Hsinchu, Taiwan

[73] Assignee: National Science Council, Taipei, Taiwan

[21] Appl. No.: 599,135

[22] Filed: Feb. 9, 1996

[51] Int. Cl.$^6$ .................................................. H01L 21/00

[52] U.S. Cl. .......................................... 438/712; 438/723

[58] Field of Search ............................. 156/643.1, 657.1, 156/659.11, 662.1; 437/40–43

[56] References Cited

PUBLICATIONS

Li–Rou Shiu, et al., "Novel Silicon Dielectric Selectively Deposited on Silicon Substrate," 1995 Annual Conference of the Chinese Society for Material Science, pp. 276–277, Apr. 21–22, 1995.

M. Sekine, et al., "Self–Aligned Tungsten Strapped Source/Drain and Gate Technology Realizing the Lowest Sheet Resistance for Sub–quarter Micron CMOS," 1994 IEEE IEDM digest abst. pp. 493–496.

*Primary Examiner*—William Powell
*Attorney, Agent, or Firm*—Hitt Chwang & Gaines, P.C.

[57] ABSTRACT

A method is capable of providing a semiconductor device with a gate having thereon a thicker silicide or metal layer and further having a lower interconnect resistance. The method is further capable of providing the semiconductor device with a polysilicon gate having a recessed tungsten structure for prevention of short circuit between the gate and the drain or the source. For forming a grooved gate structure, a photo-resist is formed on the polysilicon gate before growing on the entire surface of the silicon substrate a silicon dioxide layer. The silicon dioxide layer and the thin gate oxidation layer on drain/source are etched vertically by a reactive ion etching until the photo-resist and the silicon surface of drain/source are exposed. A plurality of spacers are thus formed on the side walls of the photo-resist/polysilicon gate. Upon stripping the photo-resist, the grooved gate structure is formed on the semiconductor device.

5 Claims, 3 Drawing Sheets

5,776,835

METHOD OF MAKING A GROOVED GATE STRUCTURE OF SEMICONDUCTOR DEVICE

FIELD OF THE INVENTION

The present invention relates generally to a method of making a semiconductor device, and more particularly to a method of making a grooved gate structure of the semiconductor device.

BACKGROUND OF THE INVENTION

The circuit speed of a semiconductor device is greatly dependent on the delay time brought about by the peripheral circuit and the metal contact resistance. As the semiconductor device is down-sized, the metal contact area is greatly reduced to result in an increase in the contact resistance. Generally speaking, when the size of the contact area of a semiconductor device is reduced, the contact resistance of the semiconductor device is increased directly. It is therefore imperative for the makers of the semiconductor devices to produce a down-sized semiconductor device, without causing a substantial reduction in the contact area of the semiconductor device. A conventional method known as "Self-Align Silicide", or SALICIDE for short, is capable of bringing about a substantial increase in the contact area of the semiconductor device so as to minimize the contact resistance of the semiconductor device. However, as the semiconductor device is continuously reduced in size, it is necessary to employ the shallow source-drain junction to inhibit the short channel effect. In the meantime, an effort must be made to reduce the sheet resistance of the drain, the source and the gate. As long as the shallow junction persists, the afore-mentioned "SALICIDE" method of the prior art has a limited effect on reducing further the sheet resistance. In addition, the amount of silicon that is consumed in the formation of silicide is about equal to the thickness of metal. For instance, 50 nm of Pt (platinum) and 60 nm of Si (silicon) are caused to react so as to form 100 nm of PtSi. In other words, the prior art "SALICIDE" method is inherently limited in that the silicide so formed is not allowed to have a thick thickness. It is generally required that the gate has a relatively low sheet resistance so as to attain a relatively low interconnect resistance. As a result, the gate must have a relatively thick layer of silicide. The problem is complicated by the fact that the gate, the drain and the source are simultaneously formed as parts of the silicide, and that the drain and the source are confined by the shallow drain-source junction, wherein the silicide layer must not be excessive in thickness so as to avoid the destruction of the shallow junction.

The prior art "SALICIDE" method is therefore replaced by a method called "selective tungsten chemical vapor deposition", or "selective W-CVD" for short. The selective W-CVD method has an inherent advantage in that the deposition thickness of tungsten is not subject to the interference from the depth of the junction. However, the selective W-CVD method is defective in design in that it is often not as selective as expected, and that it may bring about the overgrowth responsible for the short circuit between the gate and the drain or the source. For prevention of the short circuit, M. Sekine, et al proposed a method of making a recessed tungsten on polysilicon gate structure, which was disclosed in an article entitled "Self-Aligned Tungsten Strapped Source/Drain and Gate Technology Realizing the Lowest Sheet Resistance for Sub-quarter Micron CMOS", 1994 IEEE IEDM digest abst. pp. 493–496. In the process of making a recessed tungsten structure by the selective W-CVD, it is necessary that a grooved gate structure must be first formed.

A method of vapor HF (hydrofluoric acid) selective etching was proposed by M. Sekine, et al. for making a grooved gate structure. As shown in FIGS. 1a–1f, after the formation of the LOCOS (local oxidation of silicon) insulation film and the thin gate insulation film 12, a phosphorus-doped PSG (phosphosilicate glass) layer having a thickness of 200 nm is deposited on an undoped polysilicon layer 11 having a thickness of 150 nm. Upon completion of a treatment, the undoped polysilicon is transformed into a doped polysilicon. The PSG/polysilicon 11 of the gate area is then defined by the photo-resist etching. Thereafter, the PSG/polysilicon outside the gate area is removed by etching before the photo-resist is stripped, as shown in FIG. 1b. The entire surface is then covered with a SiN layer having a thickness of 65 nm, as shown in FIG. 1c. The side walls of the gate 16 are provided with spacers 13 by means of the reactive ion etching (called RIE for short), with the drain 14 and the source 15 being exposed, as shown in FIG. 1d. After the formation of the spacers 13, the PSG layer on the gate 16 is stripped by the vapor HF selective etching, thereby resulting in the formation of the grooved gate structure, as shown in FIG. 1e. Subsequently, drain/source diffusion layers are formed by ion implantation and annealing. The gate 16, the drain 14 and the source 15 are provided thereon with a thicker layer of tungsten by the selective W-CVD, as shown in FIG. 1f. The short circuit between the gate and the drain/source is therefore averted by the grooved gate structure. However, the above-described method for making the grooved gate structure is too complicated and is therefore not cost-effective. In addition, the electrical characteristics of the semiconductor device can be adversely affected by the damage caused by the stress exerting on the silicon surface by the SiN material, which is used in the above-mentioned method for forming the side-wall spacers of the gate because of the fact that the SiN material is relatively resistant to corrosion caused by hydrofluoric acid.

SUMMARY OF THE INVENTION

It is therefore the primary objective of the present invention to provide an improved method for making a grooved gate structure of semiconductor device.

The method of the present invention comprises the steps of: (a) coating a photo-resist layer on a doped polysilicon layer formed on a silicon (Si) substrate; (b) defining a gate area of said doped polysilicon layer by photolithography, wherein the photo-resist are stripped except the portion on said gate area; (c) etching vertically the doped polysilicon layer by an anisotropic etching for stripping the doped polysilicon of all areas except the gate area covered by the photo-resist; (d) growing by means of a liquid phase deposition a silicon dioxide layer on the surfaces of the Si substrate and the photo-resist/doped polysilicon; (e) etching vertically the silicon dioxide layer by an anisotropic etching until the silicon substrate and the photo-resist are exposed and spacers are formed on the side walls of the photo-resist/doped polysilicon; and (f) forming a grooved gate structure by stripping the photo-resist.

In the step (d) of the method of the present invention, the liquid phase deposition of silicon dioxide is brought about by a silica-supersaturated hydrofluosilicic acid ($H_2SiF_6$) solution at a temperature ranging between 35° and 55° C. for a period lasting between 0.5 and 5.0 hours. In addition, the silica-supersaturated hydrofluosilicic acid solution contains 0.5–4.0M concentration of hydrofluosilicic acid and 0.4–1.0% of boric acid based on the mole of the hydrofluosilicic acid.

According to the method of the present invention, the silica-supersaturate hydrofluosilicic acid solution is prepared by diluting with water a silica-saturated hydrofluosilicic acid solution, which contains 4M concentration of hydrofluosilicic acid, to a silica-saturated hydrofluosilicic acid solution containing 3.8M concentration of hydrofluosilicic acid; and then mixing the diluted silica-saturated hydrofluosilicic acid solution with a boric acid solution of 0.1M concentration in a volumetric ratio ranging between 50:8 and 50:20 (hydrofluosilicic acid solution:boric acid solution).

The anisotropic etchings referred to in the steps (c) and (e) of the method of the present invention are preferably the reactive ion etching (RIE).

The foregoing features, functions and advantages of the method of the present invention will be more readily understood upon a thoughtful deliberation of the following detailed description of the present invention in conjunction with the accompanying drawings.

DETAILED DESCRIPTION OF THE INVENTION

The present invention provides a simple method for making a grooved gate structure of semiconductor device, without the use of the SiN material for making the side-wall spacers of the gate. According to the present invention, the formation of the spacers of the gate is attained by the use of silicon dioxide. The method of the present invention comprises a process in which a photo-resist is formed on a polysilicon gate. Thereafter, a silicon dioxide layer is conformally deposited on the entire surface of the silicon substrate including on the surfaces of the photo-resist/polysilicon gate. Vertical etchings of the silicon dioxide layer and the thin gate oxidation layer on drain/source are carried out by the reactive ion etching (RIE) until such time when the photo-resist and the silicon surface of drain/source are exposed. The spacers are formed on the side walls of the photo-resist/polysilicon gate. As the photo-resist is stripped, a grooved gate structure is thus formed.

Figure 1A:
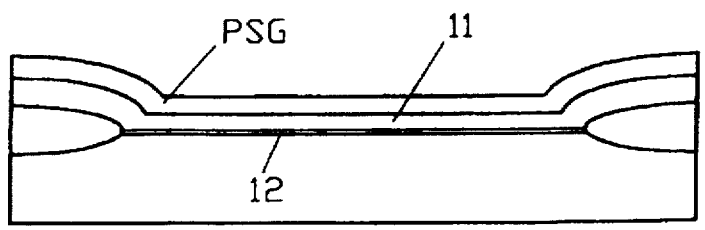
FIGS. 1a–1f are schematic views illustrating the process flow of a prior art method of making a grooved gate structure of semiconductor device.
Figure 1B:
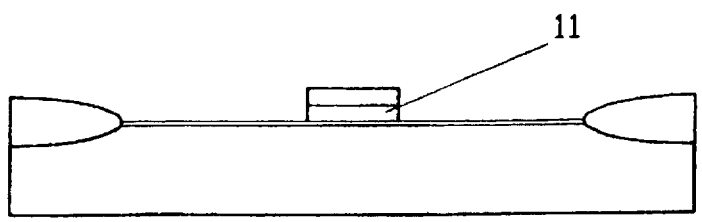
Figure 1C:
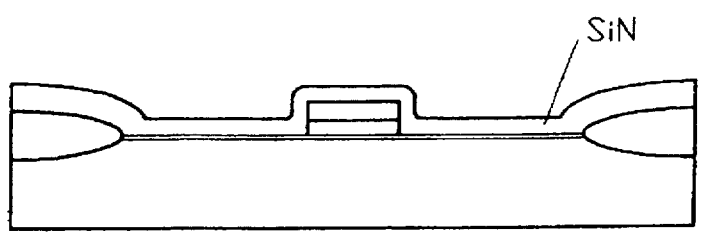
Figure 1D:
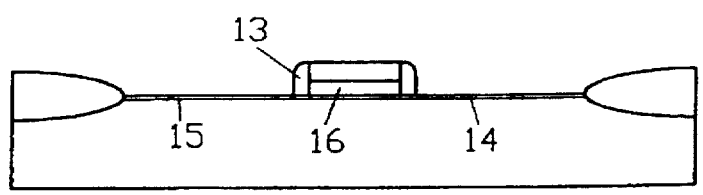
Figure 1E:
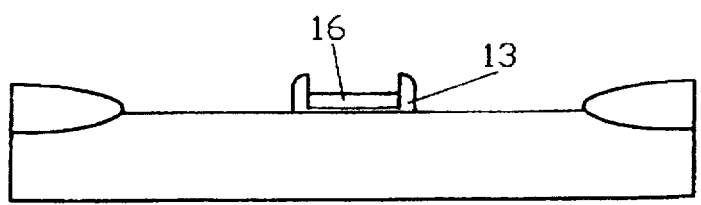
Figure 1F:
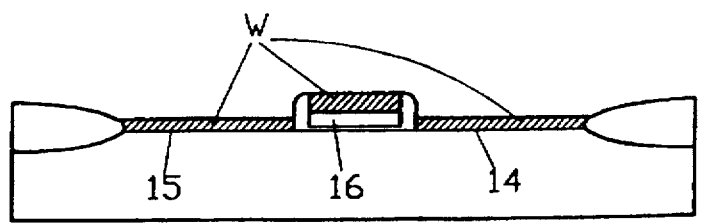
Figure 2A:
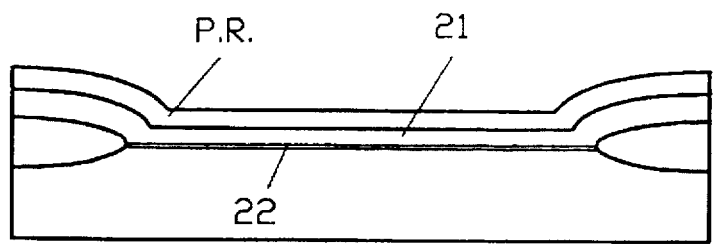
FIGS. 2a–2f are schematic views illustrating the process flow of the method of the present invention for making a grooved gate structure of semiconductor device.
Figure 2B:
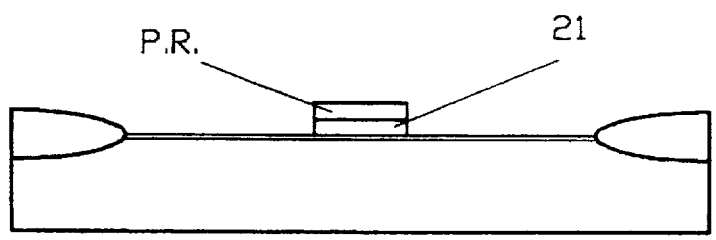
Figure 2C:
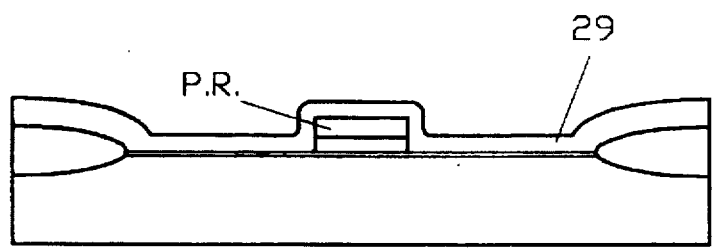
Figure 2D:
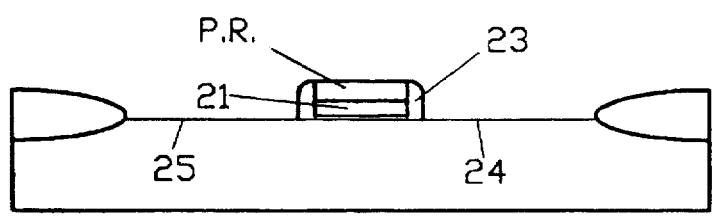
Figure 2E:
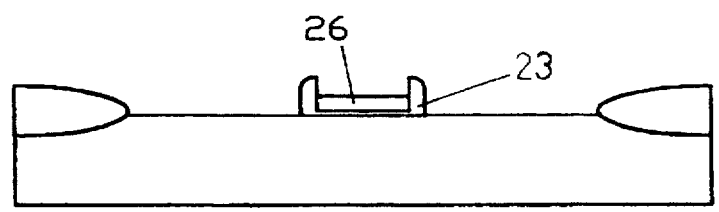
Figure 2F:
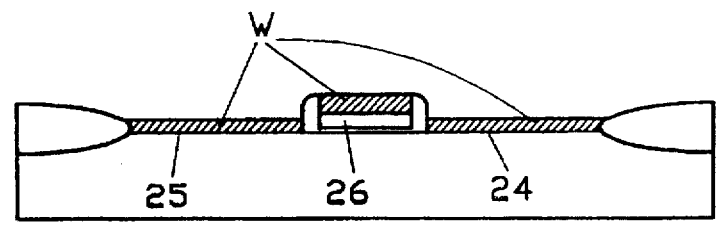

According to the method of the present invention, the formation of the grooved gate structure is accomplished by making use of the liquid phase deposition (LPD) to grow at the room temperature a silicon dioxide ($SiO_2$) layer on the entire surface of the Si substrate (including on the surfaces of the photo-resist and polysilicon gate). Detailed procedures of the present method are described in the following. As illustrated in FIG. 2a–2f, a local oxidation of silicon (LOCOS) insulation film and a thin gate insulation film 22 are first formed on a Si substrate before a doped polysilicon layer 21 is attained. Thereafter, a photo-resist layer P.R. is coated thereon (FIG. 2a). A gate area of the polysilicon layer 21 is subsequently defined by photolithography, wherein the photo-resist is stripped except the portion on said gate area. The reactive ion etching is then employed to strip the polysilicon layer 21 by using the photo-resist P.R. as a mask (FIG. 2b). An insulation layer 29 of LPD-$SiO_2$ is grown at the room temperature on the entire surface of the Si substrate, including the surfaces of the photo-resist P.R. mask and the polysilicon (FIG. 2c). The LPD-$SiO_2$ layer 29 has an excellent step coverage, which means that the thickness of the LPD-$SiO_2$ layer 29 is substantially uniform throughout all surfaces. The LPD-$SiO_2$ layers 29 on the drain 24, the source 25 and the photo-resist P.R. are stripped by reactive ion etching, and the thin gate insulation film 22 on the drain 24 and the source 25 are also stripped by the reactive ion etching until the silicon surfaces of the drain 24 and the source 25, and the photo-resist P.R. are exposed. In the meantime, spacers 23 are formed on the side walls of the photo-resist/polysilicon gate (FIG. 2d). Finally, a grooved gate structure 26 is formed after the exposed photo-resist is stripped (FIG. 2e). Drain/source diffusion layers are then formed by ion implantation and annealing before the selective W-CVD is employed to deposit respectively a thicker layer of tungsten (W) on the gate 26, the drain 24 and the source 25, as shown in FIG. 2f. It is therefore readily apparent that the method of the present invention is relatively more easy and simple than the method proposed by M. Sekine, et al., and that the method of the present invention is therefore more cost-effective. In addition, the SiN material is not used in the method of the present invention.

The liquid phase deposition of the silicon dioxide (LPD-$SiO_2$) layer of the present invention involves the use of a silica-supersaturated hydrofluosilicic acid as an impregnation solution which is formed by dissolving 35 grams of the silicon dioxide powder having 99.99% purity in one liter of 4M hydrofluosilicic acid; and then mixing 50 ml of the hydrofluosilicic acid saturated with silicon dioxide with 2.63 ml of water and 12 ml of 0.1M boric acid. The silicon substrate having thereon the photo-resist/polysilicon gate as illustrated in FIG. 2b is impregnated in the impregnation solution at 35° C. for one hour so as to form thereon a silicon dioxide liquid phase deposition film having a thickness of 1500 angstrom (Å).

Figure 3:
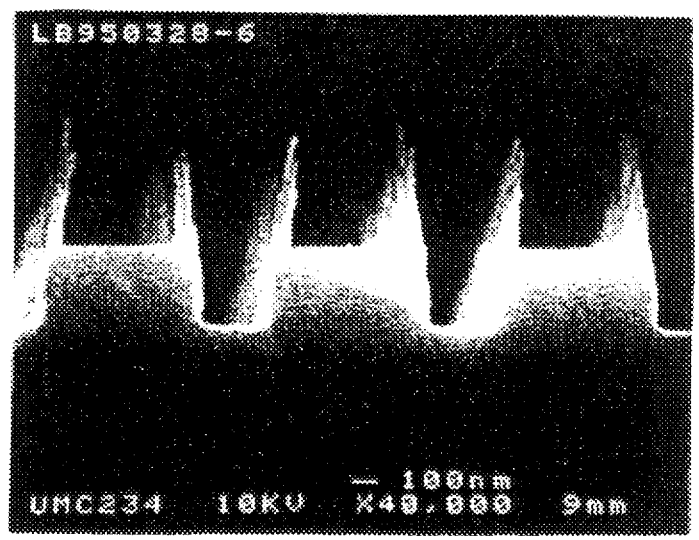
FIG. 3 is a scanning electron microscopic view showing the cross section of a semiconductor device having a grooved gate structure made by the method of the present invention.

It is therefore readily apparent that a semiconductor device having a grooved gate structure can be made at a relatively low cost. Such grooved gate structure made by the method of the present invention is depicted clearly by a cross-sectional scanning electron microscopic (SEM) view, as shown in FIG. 3.

The embodiment of the present invention described above is to be regarded in all respects as being merely illustrative and not restrictive. Accordingly, the present invention may be embodied in other specific forms without deviating from the spirit thereof. The present invention is therefore to be limited only by the scopes of the following appended claims.

What is claimed is:

1. A method of making a grooved gate of semiconductor device, said method comprises the steps of:
   (a) coating a photo-resist layer on a doped polysilicon layer formed on a silicon substrate;
   (b) defining a gate area of said doped polysilicon layer by photolithography, wherein the photo-resist are stripped except the portion on said gate area;
   (c) etching vertically the doped polysilicon layer by an anisotropic etching for stripping the doped polysilicon of all areas except the gate area covered by the photo-resist;

(d) growing by means of a liquid phase deposition a silicon dioxide layer on the surfaces of the Si substrate and the photo-resist/doped polysilicon;

(e) etching vertically the silicon dioxide layer by an anisotropic etching until the silicon substrate and the photo-resist are exposed and spacers are formed on the side walls of the photo-resist/doped polysilicon; and (f) forming a grooved gate structure by stripping the photo-resist.

2. The method as defined in claim 1, wherein said liquid phase deposition referred to in the step (d) is carried out at a temperature ranging between 35° and 55° C. for a period lasting between 0.5–5.0 hours in a silica-supersaturated hydrofluosilicic acid solution containing 0.5–4.0M concentration of hydrofluosilicic acid and 0.4–1.0% of boric acid based on the mole of hydrofluosilicic acid.

3. The method as defined in claim 2, wherein said silica-supersaturated hydrofluosilicic acid solution is prepared by diluting with water a silica-saturated hydrofluosilicic acid solution, which contains 4M concentration of hydrofluosilicic acid, to a silica-saturated hydrofluosilicic acid solution containing 3.8M concentration of hydrofluosilicic acid; and then mixing the diluted silica-saturated hydrofluosilicic acid solution with a boric acid solution of 0.1M concentration in a volumetric ratio of the diluted silica-saturated hydrofluosilicic acid solution to the 0.1M boric acid solution ranging from 50:8 to 50:20.

4. The method as defined in claim 1, wherein said anisotropic etching referred to in the step (c) is a reactive ion etching (RIE).

5. The method as defined in claim 1, wherein said anisotropic etching referred to in the step (e) is a reactive ion etching (RIE).

\* \* \* \* \*